United States Patent
Daniel et al.

(10) Patent No.: US 8,809,110 B2
(45) Date of Patent: Aug. 19, 2014

(54) HIGH THROUGHPUT PARALLEL BACKSIDE CONTACTING AND PERIODIC TEXTURING FOR HIGH-EFFICIENCY SOLAR CELLS

(75) Inventors: Claus Daniel, Knoxville, TN (US);
Craig A. Blue, Knoxville, TN (US);
Ronald D. Ott, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 310 days.

(21) Appl. No.: 12/981,899

(22) Filed: Dec. 30, 2010

(65) Prior Publication Data
US 2012/0167956 A1  Jul. 5, 2012
US 2012/0291854 A2  Nov. 22, 2012

(51) Int. Cl.
*H01L 31/18* (2006.01)
*H01L 31/0236* (2006.01)

(52) U.S. Cl.
CPC ........... *H01L 31/02363* (2013.01); *Y02E 10/50* (2013.01)
USPC .................. 438/98; 438/71; 438/72; 136/251

(58) Field of Classification Search
None
See application file for complete search history.

(56) References Cited

U.S. PATENT DOCUMENTS

| | | | |
|---|---|---|---|
| 5,002,572 A | 3/1991 | Picha | |
| 5,777,342 A * | 7/1998 | Baer | 250/492.2 |
| 7,063,896 B2 | 6/2006 | Mucklich et al. | |
| 7,109,517 B2 * | 9/2006 | Zaidi | 257/22 |
| 2004/0001964 A1 * | 1/2004 | Ohkura et al. | 428/596 |
| 2004/0263860 A1 * | 12/2004 | Johnson | 356/499 |
| 2009/0301549 A1 * | 12/2009 | Moslehi | 136/251 |
| 2010/0218821 A1 * | 9/2010 | Kim et al. | 136/256 |
| 2011/0180122 A1 * | 7/2011 | Tanner et al. | 136/244 |

OTHER PUBLICATIONS

Ferry et al., "Improved red-response in thin film a-Si:H solar cells with soft-imprinted plasmonic back reflectors", Applied Physics Letters 95, 183503 (2009) (3 pages).*
Hirano et al., "Fabrication of micro holographic optical elements by interference of a single pulse from a femtosecond laser", Conference on Lasers and Electro-Optics (CLEO), pp. 125-126 (2001).*
Hiran et al, Citation / Abstract of "Fabrication of micro holographic optical elements by interference of a single pulse from a femtosecond laser", Conference on Lasers and Electro-Optics (CLEO) 125-126 (2001) (article listed under U above.*
Li et al., "Laser Ablation Patterning by Interference Induces Directional Cell Growth," IEEE Transactions on Nanobioscience, vol. 2, No. 3, Sep. 2003, pp. 138-145.
Daniel, et al., "Bio-Mimetic Scaling of Mechanical Behavior of Thin Films, Coatings, and Surfaces by Laser Interference Metallurgy," Advanced Engineering Materials, 2005, 7 No. 9, pp. 823-826.
Daniel, et al., "Phase-Modulated Hierarchial Surface Structures by Interfering Laser Beams," Advanced Engineering Materials, 2006, 8, No. 10, pp. 925-932.

* cited by examiner

*Primary Examiner* — Johannes P Mondt
(74) *Attorney, Agent, or Firm* — Luedeka Neely Group, P.C.

(57) ABSTRACT

Disclosed are configurations of long-range ordered features of solar cell materials, and methods for forming same. Some features include electrical access openings through a backing layer to a photovoltaic material in the solar cell. Some features include textured features disposed adjacent a surface of a solar cell material. Typically the long-range ordered features are formed by ablating the solar cell material with a laser interference pattern from at least two laser beams.

4 Claims, 3 Drawing Sheets

HIGH THROUGHPUT PARALLEL BACKSIDE CONTACTING AND PERIODIC TEXTURING FOR HIGH-EFFICIENCY SOLAR CELLS

GOVERNMENT RIGHTS

This invention was made with government support under Contract No. DE-AC05-00OR22725 awarded by the U.S. Department of Energy. The government has certain rights in the invention.

FIELD

This disclosure relates to the field of solar cells. More particularly, this disclosure relates to pattern features for solar cells to enhance photon absorption and electrical conductivity.

BACKGROUND

Solar cells are typically fabricated as layers of materials. For example a typical silicon solar cell has a top encapsulating layer made of glass or other clear material such clear plastic to seal the cell from the external environment, a silicon layer having n-type silicon and p-type silicon sub-layers with a pn-junction between them, an optional antireflective layer between the encapsulating layer and the silicon layer, a top grid disposed adjacent the top of the silicon layer (the cathode), and a metal backing layer under the silicon layer (the anode).

Improved photovoltaic efficiency is a continuing goal for wafer-silicon-based photovoltaic cells. Reducing cell thickness is one way to obtain increased efficiency and meet other desirable design criteria, such as reduced weight. Typically, aluminum is used as a full area back reflector and electrical connector for solar cells. However, reducing the thickness of the aluminum reflector may result in significant warping of the cell. Improving photo absorption is another way to improve photovoltaic efficiency. However, many solar cell materials have high reflectance properties, which reduce the amount of photo energy absorbed by the solar cell. What are needed therefore are improved backing structures for solar cells that provide adequate electrical conductivity and physical strength with a reduction in weight, and improved configurations of solar cell materials that reduce reflectance and enhance absorption of solar energy.

SUMMARY

The present disclosure provides methods of fabricating a pattern of long-range ordered electrical access openings to a photovoltaic material in a solar cell having a backing layer. The methods typically involves ablating the backing layer with a laser interference pattern from at least two laser beams to form the pattern of electrical access openings through the backing layer to the photovoltaic material. Also disclosed are solar cells having a pattern of long-range ordered electrical access openings through a backing layer to a photovoltaic material. Generally the backing layer has a thickness that is within a range from approximately 0.5 micrometers to approximately 10 micrometers. Typically the pattern of electrical access openings has an average spacing distance between the openings that is within a range from approximately 1 micrometer to approximately 50 micrometers and the electrical access openings have an average width that is within a range from approximately 0.5 micrometers to approximately 10 micrometers. Further disclosed are methods of fabricating a pattern of long-range ordered textured features on a surface of a solar cell material. The methods typically involve ablating the surface of the solar cell material with a laser interference pattern from at least two laser beams to form the pattern of textured features. The disclosure also provides a solar cell having a pattern of long-range ordered textured features disposed adjacent a surface of a solar cell material. Generally the pattern of textured features has a plurality of spacing distances between the features with an average spacing distance that is within a range from approximately 1 micrometer to approximately 50 micrometers, and the textured features have an average width that is within a range from approximately 0.5 micrometers to approximately 10 micrometers.

BRIEF DESCRIPTION OF THE DRAWINGS

Various advantages are apparent by reference to the detailed description in conjunction with the figures, wherein elements are not to scale so as to more clearly show the details, wherein like reference numbers indicate like elements throughout the several views, and wherein.

DETAILED DESCRIPTION

Figure 1:
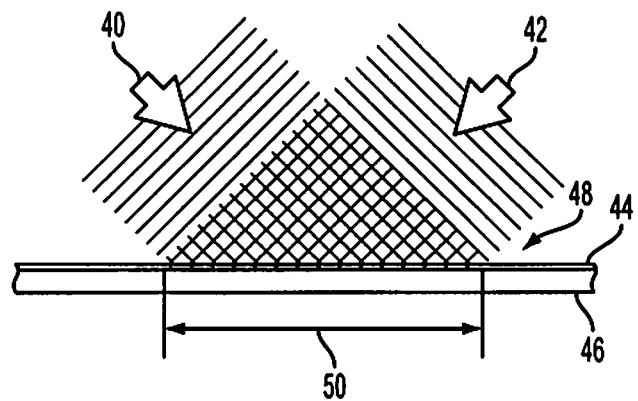
FIG. 1 is a somewhat schematic view of a laser interferometry system for modification of a solar cell material.

In the following detailed description of the preferred and other embodiments, reference is made to the accompanying drawings, which form a part hereof, and within which are shown by way of illustration the practice of specific embodiments of solar cells having a pattern of electrical access openings through a backing layer to a photovoltaic material, and solar cells having a pattern of textured features in the surface of a solar cell material. Solar cell materials include any layer of a solar cell structure, including encapsulating layers, photovoltaic material layers (e.g., silicon layers), antireflective layers, grid layers, and backing layers. The following detailed description further presents preferred and other embodiments of methods of fabricating a pattern of electrical access openings to a photovoltaic material in a solar cell having a backing layer and methods of fabricating a pattern of textured features on a surface of a solar cell material. It is to be understood that other embodiments may be utilized, and that structural changes may be made and processes may vary in other embodiments.

As previously indicated, replacement of the conventional aluminum backing layer used in wafer-silicon-based photovoltaic cells with a lighter and preferably more electrically and photo-optically efficient material is one approach to improving the attractiveness of photovoltaic solar cells. Cold-sprayed or stress-adapted dielectric or electrically insulative thin films are potential candidates for replacing the aluminum backing layer. An example of such a thin film is layered $SiO_2/SiN/SiO_2$. While such materials may have some desirable properties they typically do not provide an efficient anode. Disclosed herein are configurations of solar cells having direct electrical access to the bottom side (typically the p-type sub-layer) of the silicon layer of a solar cell through a plurality of electrical access openings formed in the backing layer. Such openings are typically formed by methods disclosed herein for ablating the backing layer with a laser interference pattern from at least two laser beams to form the pattern of electrical access openings that pass entirely through the backing layer to the photovoltaic material.

Further disclosed herein are configurations of solar cells having a textured pattern on a surface of a solar cell material. Such textured patterns may be used, for example, to reduce the reflectivity of a surface or to improve adhesion of bonding materials. Such textured features are typically formed by methods disclosed herein for ablating the surface of a solar cell material with a laser interference pattern from at least two laser beams to form the pattern of textured features.

During such laser interference structuring, a primary laser beam is typically divided into two or more coherent beams that are then guided by an optical system to interfere with each other at the sample surface. The standing optical wave describes a periodic intensity pattern having an intensity variation wavelength. The pattern may be a one-dimensional line-like pattern or a two-dimensional net-like or dot-like pattern, or a combination of a one-dimensional and two-dimensional pattern. As used herein the suffix "-like" is used to indicate that the indicated features have the same or nearly the same appearance that is indicated by the noun it follows. So for example, a "dot-like" feature has the appearance of a dot, or nearly the same appearance as a dot.

The angles between the beams define the two-dimensional interference fringe spacing in the intensity distribution. Spacing may be calculated for a two-beam interference experiment by employing the following formula:

$$d = \frac{\lambda}{2\sin\varphi} \qquad \text{Eq'n 1}$$

where $\varphi$ is the angle between the two incident beams and $\lambda$ is the wavelength of the light. While Equation 1 indicates that the spacing of the intensity distribution may be scaled down to half of the laser wavelength, the practical limit is typically from approximately 50 to 100 μm due to various equipment limitations. Two or more planar laser beams guided by an optical system may be used to create various interference patterns. For example, two beams may be employed to create line-like openings in a solar cell backing layer. Three or more non-planar beams may be used to create net-like or dot-like openings in a solar cell backing layer.

FIG. 1 illustrates an exemplary laser interference system. A first laser beam 40 and a second laser beam 42 are directed at backing layer 44 of a solar cell 46, to form an interference pattern that produces a plurality of open spaces 48 in the backing layer 44. Typically both the first laser beam 40 and the second laser beam 42 may be one or more pulses from a Nd:YAG laser, each typically from one up to approximately ten nanoseconds in duration. However in alternate embodiments other lasers may be used and pulses may range from femtoseconds, to over picoseconds, to nanoseconds, to milliseconds. The plurality of open spaces 48 extend over a structured area distance 50 (in one dimension) that may range from a few hundred micrometers to approximately 10 millimeters. The structured area diameter 50 may increase as laser power increases. With current-generation lasers the structured area diameter 50 is typically 5-8 mm. Next generation of lasers may provide sufficient power to increase the diameter to perhaps several centimeters or more.

Generally half wavelength structuring cannot be achieved for most materials. Even in the case where the intensity distribution shows fringe spacing on the sub-micrometer scale, the lowest spacing length is limited by the heat transfer in the material. In metals, for example, the optical energy delivered is mainly converted into heat, which then follows the three-dimensional heat diffusion equation. The heat diffusion length depends on the interaction time of the laser with the material.

The heat diffusion length is defined as the distance from the heat source in which the temperature is lowered to the 1/e fraction of the initial temperature. This length grows with longer pulse duration and can be approximated with Equation 2.

$$l_{diff} \approx 2\left(\tau_p \frac{k_t}{\rho c_p}\right)^{1/2} \qquad \text{Eq'n 2}$$

where $t_p$ is the pulse duration or involved time regime; $k_t$ is the thermal conductivity of irradiated material; r is the density; and $c_p$ is the thermal capacity. The minimum feature size cannot be smaller than the periodicity of the intensity pattern or the diffusion length, whichever is greater.

In the case of ultra-short femto second (fs) laser pulses, Equation 2 predicts a limit which is much lower than half of the laser wavelength. Therefore, a feature spacing of half of the wavelength may be possible. Even in this case, however, a feature spacing equal to half of the laser wavelength may not be achieved in practice. Based on a two-temperature model for fs-laser irradiation, an interaction time of up to 100 ps may be predicted, which is three orders of magnitude longer than the pulse itself. If one counts that as "pulse duration," the diffusion length can be approximated at 200 nm (for copper).

Another issue based on the use of an fs-laser should generally be considered. According to the speed of light, a pulse in air with duration of about 100 fs has a length of about 30 μm. Therefore, the path length of each beam has to be precisely adjusted. It may be possible to provide such precision by using an optical delay line in one of the beam paths. The theoretical limit for the distance in any intensity distribution pattern is given by the diffraction limit which is about ½ times the wavelength used. However, this is only possible for extremely short pulses (ps/fs). For longer pulses the theoretical limit of resolution of this pattern into a physical structure is limited by the thermal diffusivity and the laser pulse duration, i.e., essentially how far heat can travel when the laser is on. For 10 ns in copper, this is limited to about 2 um. As a result, it may be possible to produce only a topographic texturing of a solar cell material layer (and not full penetration of some solar cell material layers) with an fs-laser.

Figure 2A:
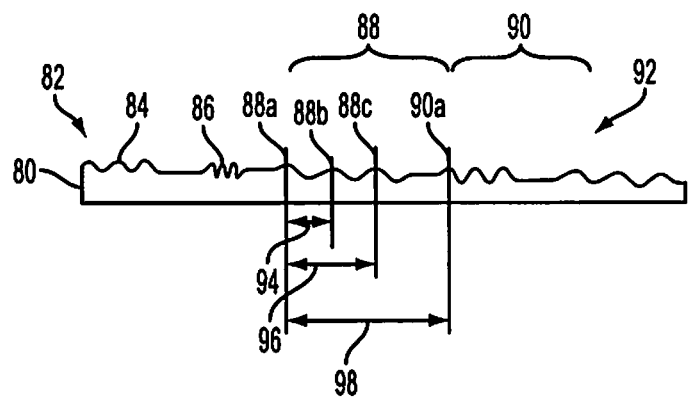
FIGS. 2A and 2B are somewhat schematic cross-sectional views of repetitive patterns applied to solar cell materials.

Micro-features that are formed adjacent the surfaces of materials or through materials may exhibit short-range ordered patterns or long-range ordered patterns or a combination of both patterns. Short-range ordered patterns and long-range ordered patterns are collectively referred to as repetitive patterns. FIG. 2A illustrates a plurality of short-range ordered patterns. In FIG. 2A a material 80 has a surface 82 that includes a plurality of topographical variations, 84, 86, 88, 90, and 92. Short-range ordered patterns are characterized by feature spacings that are constant only for a few adjacent features. For example, features 88a, 88b, 88c and 90a are adjacent features. The spacing between a first feature 88a and its nearest neighbor feature 88b is a pattern spacing distance 94. The spacing between the first feature 88a and (in one direction) its second-nearest neighbor feature 88c is a separation distance 96 that is substantially two times the pattern spacing distance 94. However the spacing between the first feature 88*a* and its third nearest neighbor feature 90*a* is a distance 98 that is not substantially three times the pattern spacing distance 94. Short-range ordered patterns may have feature spacings that are constant for two nearest neighbors, or three nearest neighbors, or four nearest neighbors, but not for more than about five nearest neighbors.

Figure 2B:
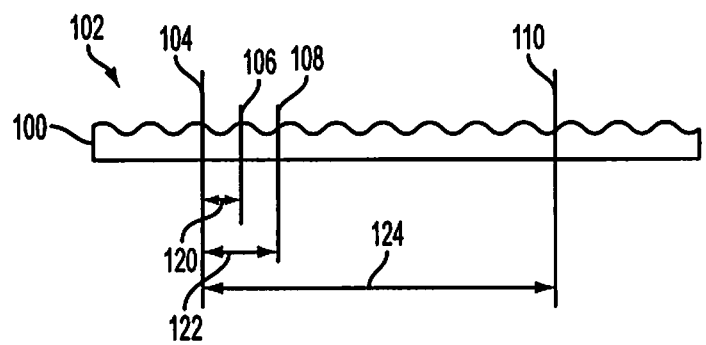

FIG. 2B illustrates a long-range ordered pattern. A material 100 has a surface 102 that includes a plurality of topographical variations, including features 104, 106, 108, and 110. The spacing between a first feature 104 and (in one direction) its nearest neighbor feature 106 is a pattern spacing distance 120. The spacing between the first feature 104 and its second-nearest neighbor feature 108 is a separation distance 122 that is substantially two times the pattern spacing distance 120. The spacing between the first feature 104 and its eighth-nearest neighbor feature 110 is a separation distance 124 that is substantially eight times the pattern spacing distance 120. Long-range ordered patterns may have such constant spacing for 10, 100, 1000 or even more repetitions.

Figure 3A:
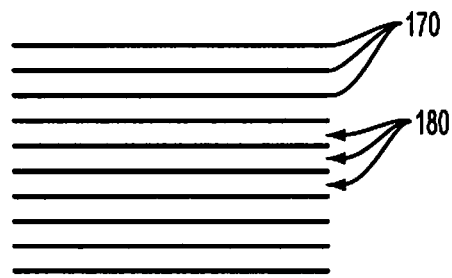
FIGS. 3A, 3B, and 3C are schematic illustrations of repetitive patterns of micro-features for solar cell materials.
Figure 3B:
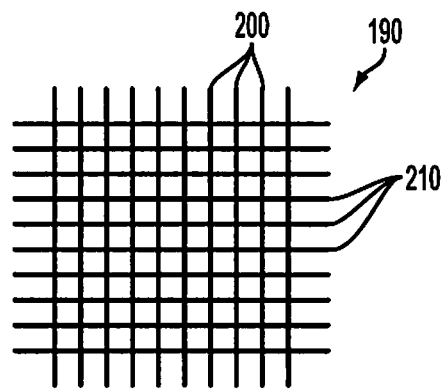
Figure 3C:
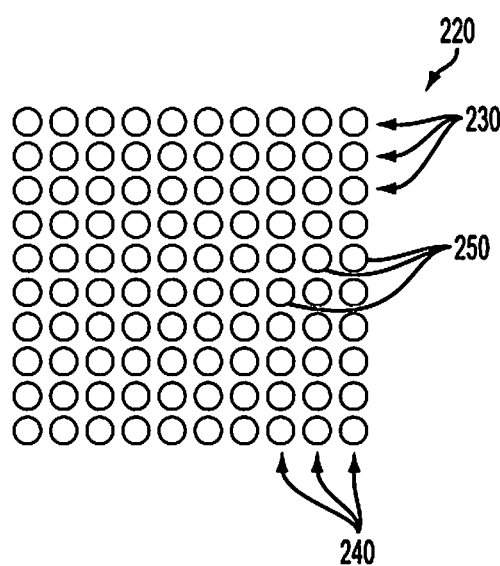

As previously indicated, laser interference structuring techniques may be used to create line-like structures and net-like protuberances with two or more planar arranged beams and dot-like structures with three or more non-planar beams. FIGS. 3A, 3B, and 3C illustrate some of the possibilities. FIG. 3A illustrates a repetitive pattern of first line-like structures 170. The first line-like structures 170 may be, for example, spaces that penetrate entirely through a layer of material, or topographical peaks, or locally densified regions, or other micro-features. FIG. 3A also illustrates a repetitive pattern of second line-like structures 180. The second line-like structures 180 may be, for example, spaces that penetrate entirely through a layer of material, or topographical valleys, or locally untreated regions. FIG. 3B illustrates a net-like structure 190. The net-like structure 190 includes a first repetitive pattern of line-like structures 200 and a second repetitive pattern of line-like structures 210. The first line-like structures 200 and the second line-like structures 210 may be, for example, spaces that penetrate entirely through a layer of material, or topographical peaks, or locally densified regions, or other micro-features. The first repetitive pattern of line-like structures 200 is disposed at a non-zero angle (in this case disposed at an orthogonal angle) to the second repetitive pattern of line-like structures 210. In the embodiment of FIG. 3A the first repetitive pattern of line-like structures 200 overlays the second repetitive pattern of line-like structures 210. The first repetitive pattern of line-like structures 200 and the second repetitive pattern of line-like structures 210 are an example of two overlaid and angulated repetitive patterns of micro-features. The first repetitive pattern of line-like structures 170 and the second repetitive pattern of line-like structures 180 in FIG. 3A are overlaid repetitive patterns of micro-features. The first repetitive pattern of line-like structures 170 and the second repetitive pattern of line-like structures 180 in FIG. 3A are not angulated repetitive patterns of micro-features because the first repetitive pattern of line-like structures 170 and the second repetitive pattern of line-like structures 180 are parallel to each other (i.e., they are not disposed at a non-zero angle to each other).

FIG. 3C illustrates dot-like structures 220. The dot like structures 220 may be open spaces (holes) that penetrate entirely through a layer of material or the dot-like structures 220 may be topographical features disposed adjacent the surface of a material. The dot-like structures 220 may be characterized as a first repetitive pattern of dot-like structures 230 disposed at a non-zero angle (in this case disposed at an orthogonal angle) to a second repetitive pattern of dot-like structures 240, even though each individual dot 250 is attributed to both the first repetitive pattern of dot-like structures 230 and the second repetitive pattern of dot-like structures 240. By virtue of this perspective the first repetitive pattern of dot-like structures 230 and the second repetitive pattern of dot-like structures 240 are an example of angulated and overlaid repetitive patterns of micro-features.

Figure 4A:
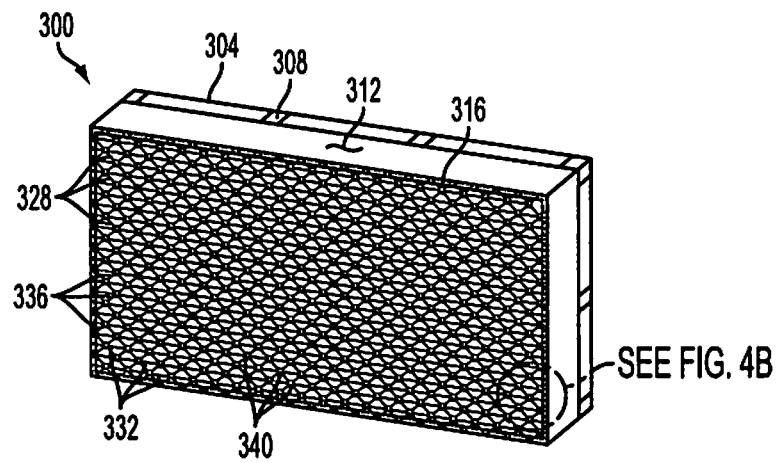
FIGS. 4A and 4B are somewhat schematic illustrations of electrical access openings in a backing layer of a solar cell assembly.
Figure 4B:
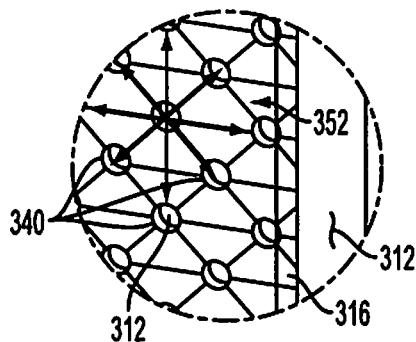

FIG. 4A illustrates a solar cell assembly 300 having an encapsulating layer 304, a top grid 308, a photovoltaic material layer 312 and a backing layer 316. The backing layer 316 typically has a substantially constant thickness. Typically the thickness of the backing layer 316 is within a range from approximately 0.5 micrometers to approximately 10 micrometers. Three laser beams have been directed at the backing layer 316, indicated by modal patterns 328, 332, and 336. The modal patterns 328, 332, and 336 each have an intensity variation wavelength that is defined by the spacing distances between the lines representing each modal pattern. The average spacing distance between the lines is typically within a range from approximately 1 micrometer to approximately 50 micrometers. The modal patterns 328, 332, and 336 have created an interference pattern at their points of intersection, which caused a pattern of dot-like electrical access openings (holes) 340 to be formed through the backing layer 316 to the photovoltaic material layer 312. In other embodiments two laser beams may be used to form a pattern of line-like electrical access openings. In other embodiments more than three laser beams may be used to form a pattern of electrical access openings. Typically electrical access openings according to the present disclosure have openings with an average width that is within a range from approximately 0.5 micrometers and 10 micrometers. FIG. 4B provides a magnified view of a portion of the holes 340.

A benefit of the disclosed approach for electrical access openings to a photovoltaic material in a solar cell is that long-range ordered features may be provided, with such features having near-perfect periodicity. Such uniformity is beneficial in order to control the current density distribution in the photovoltaic material. For example, referring again to FIG. 4B, each of the interior holes 340 has six spacing distances in six directions 352 between itself and its neighbors. Spacing distances are measured from centerline to centerline. Typically the average spacing distance between the openings is within a range from approximately 1 micrometer to approximately 50 micrometers. It is preferable that for at least a substantial portion of the interior holes 340 that the standard deviation in spacing distances between adjacent interior holes 340 in each of the six directions 352 be within a range from about ten percent to about fitly percent of the average spacing distance in that direction.

Figure 5:
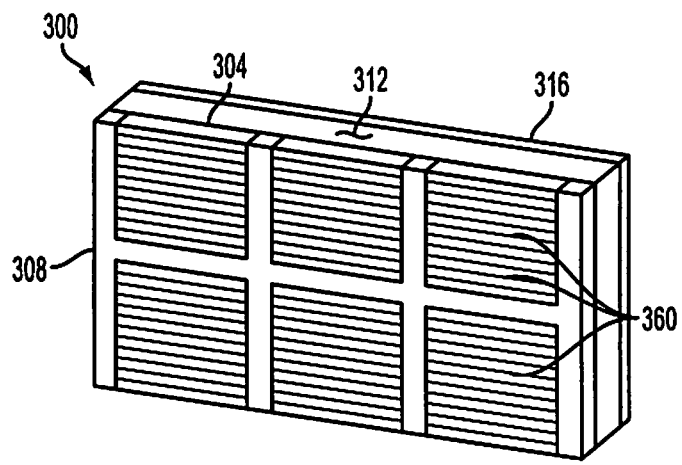
FIG. 5 is a somewhat schematic illustration of textured features of a solar cell material.

FIG. 5 illustrates the front surface of the solar cell assembly 300 of FIGS. 4A and 4B. A plurality of long-range ordered textured features 360 (in this case, lines) have been formed on a surface (in this case, the front surface) of a solar cell material (in this case the encapsulating layer 304). The textured features 360 were formed by ablating the surface of the encapsulating layer 304 with a laser interference pattern from two laser beams to form the pattern of line-like textured features 360. In other embodiments three laser beams may be used to form a pattern of net-like textured features or a pattern of dot-like textured features. In some embodiments more than three laser beams may be used to form a pattern of textured features. The pattern of textured features 360 has an average spacing distance between the features that is within a range from approximately 1 micrometer to approximately 50 micrometers. The textured features have an average width that is within a range from approximately 0.5 micrometers to approximately 10 micrometers.

Using readily available technology up to 79 million local points may be created in one step on an area of approximately 0.27 cm$^2$. With future laser systems of higher power and larger beams, this capability is expected to increase dramatically. Available high-power short-pulse systems are capable of treating a surface of 1.35 cm$^2$ in a single step with an area coverage speed of up to 135 cm$^2$/s. Thus a 400 cm$^2$ wafer may be processed in about 2.96 s.

Due to the periodic intensity distribution, controlled high-temperature gradients of more than 1,000K over lateral sub-micrometer distances may be realized without any significant thermal damage or temperature rise in surrounding material. The laser light is capable of controlling both the surface topography and the surface microstructure. The laser pulse duration is typically on the order of nanoseconds for sub-micrometer spacings or femtoseconds for nano-sized spacings. Therefore, the technique may, for example, result in a high-speed micro-metallurgical treatment with grain sizes on the order of nanometers, feature sizes of sub-micrometers to micrometers, and structured areas on the order of a square centimeter in one step in a fraction of a second. The shape and distribution of features introduced by the interference pattern may be designed to follow precisely calculations based on wave summation and are generally very homogeneous. The patterns typically show a very high lateral long-range order and obtain a specific chosen topographic frequency for stress-reduced back side contact through a dielectric film. For example, a process such as metal vapor deposition that is applied over a perforated backing layer may be used to form micro- and nano-sized aluminum contacts that are separated by distances of a few micrometers. Such electrical contacts may collect a charge without stressing the silicon and warping the cell.

Typically the technique does not require processing under special (controlled) atmospheres, low or high pressure, or vacuum systems. However, if other processes or the material composition need special atmospheres or a vacuum, the technology may still be used. For example, the laser beams may be freely guided through windows to process solar cells in a vacuum system, or the entire laser beam interference apparatus may be placed inside a controlled atmosphere chamber. Thus, the options for noncontact "optical stamping" with or without a special atmosphere provide a high degree of flexibility.

Optimization through wavelength selection, pulse number, energy delivery per laser pulse, and geometric arrangement of optics enables precise control of feature sizes and etching (ablation) depth. The additional effect of absorption coefficient change and absorption mechanism participation in a multiple-material system may be used to create customized threshold photo-property definitions. For example, a combination of photochemical and photothermal absorption may be utilized to establish a specific temperature rise and etching depth. The capability to make abrupt changes in these mechanisms may provide very precise control of defined etching steps, such as stop-go criteria control to etch or ablate a material until another material reaches the surface.

In summary, embodiments disclosed herein provide a non-contact mode of structuring of solar cell surfaces that is very flexible compared with conventional contact mode processes such as stamping or nano-imprinting. This laser processing technology with little or no surface damage offers the potential for high-quality contacts on the back as well as texturing the front surface, resulting in high-performance, low-cost solar cells. The foregoing descriptions of embodiments have been presented for purposes of illustration and exposition. They are not intended to be exhaustive or to limit the embodiments to the precise forms disclosed. Obvious modifications or variations are possible in light of the above teachings. The embodiments are chosen and described in an effort to provide the best illustrations of principles and practical applications, and to thereby enable one of ordinary skill in the art to utilize the various embodiments as described and with various modifications as are suited to the particular use contemplated. All such modifications and variations are within the scope of the appended claims when interpreted in accordance with the breadth to which they are fairly, legally, and equitably entitled.

What is claimed is:

1. A method of fabricating a pattern of long-range ordered electrical access openings through a backing layer of a solar cell to provide access to a photovoltaic material adjacent the backing layer, the method comprising:
   directing at least two at least partially overlapping laser beams onto the backing layer to form an interference pattern comprising a plurality of first substantially equally-spaced parallel lines;
   directing at least two at least partially overlapping laser beams onto the backing layer to form an interference pattern comprising a plurality of second substantially equally-spaced parallel lines disposed at a non-zero angle with respect to the first parallel lines; and
   exposing the backing layer to the interference patterns for a time sufficient to ablate the backing layer to form the pattern of electrical access openings completely through the backing layer to expose the photovoltaic material, the electrical access openings disposed only at locations where the first parallel lines intersect the second parallel lines.

2. The method of claim 1 wherein an average spacing distance between adjacent first parallel lines is within a range from approximately 1 micrometer to approximately 50 micrometers, and wherein an average spacing distance between adjacent second parallel lines is within a range from approximately 1 micrometer to approximately 50 micrometers.

3. The method of claim 1 wherein the electrical access openings have an average width within a range from approximately 0.5 micrometer to less than 10 micrometers.

4. The method of claim 1 wherein a standard deviation in spacing distance between adjacent electrical access openings ranges from about 10 percent to about 50 percent of the average spacing distance.

* * * * *